(12) United States Patent
White et al.

(10) Patent No.: US 9,407,239 B2
(45) Date of Patent: Aug. 2, 2016

(54) WIDE BANDWIDTH AUTOMATIC TUNING CIRCUIT

(75) Inventors: Carson R. White, Agoura Hills, CA (US); Joseph S. Colburn, Malibu, CA (US); Michael W. Yung, Los Angeles, CA (US); Donald A. Hitko, Grover Beach, CA (US)

(73) Assignee: HRL Laboratories, LLC, Malibu, CA (US)

( * ) Notice: Subject to any disclaimer, the term of this patent is extended or adjusted under 35 U.S.C. 154(b) by 448 days.

(21) Appl. No.: 13/472,396

(22) Filed: May 15, 2012

(65) Prior Publication Data

US 2013/0009722 A1    Jan. 10, 2013

Related U.S. Application Data

(63) Continuation-in-part of application No. 13/177,479, filed on Jul. 6, 2011.

(60) Provisional application No. 61/505,037, filed on Jul. 6, 2011.

(51) Int. Cl.
    *H03H 7/40*    (2006.01)
    *H03H 11/30*   (2006.01)

(52) U.S. Cl.
    CPC ....... *H03H 11/30* (2013.01); *H03H 7/40* (2013.01)

(58) Field of Classification Search
    CPC .................................. H03H 7/40; H03H 11/30
    USPC .................................... 333/17.3, 32, 213–217
    See application file for complete search history.

(56) References Cited

U.S. PATENT DOCUMENTS

| | | | |
|---|---|---|---|
| 4,234,960 | A | 11/1980 | Spilsbury et al. |
| 4,904,952 | A | 2/1990 | Tanimoto |
| 5,392,002 | A | 2/1995 | Delano |
| 5,489,878 | A | 2/1996 | Gilbert |
| 6,081,167 | A | 6/2000 | Kromat |
| 6,121,940 | A | 9/2000 | Skahill |
| 6,411,261 | B1 | 6/2002 | Lilly |
| 6,476,771 | B1 | 11/2002 | McKinzie |
| 6,483,480 | B1 | 11/2002 | Sievenpiper |
| 6,509,875 | B1 | 1/2003 | Nair |

(Continued)

FOREIGN PATENT DOCUMENTS

| | | |
|---|---|---|
| CN | 101853974 A | 10/2010 |
| CN | 102005648 A | 4/2011 |

(Continued)

OTHER PUBLICATIONS

From U.S. Appl. No. 13/441,730, filed Apr. 6, 2012, Office Action mailed on Mar. 13, 2014.

(Continued)

*Primary Examiner* — Dean Takaoka
*Assistant Examiner* — Alan Wong
(74) *Attorney, Agent, or Firm* — Ladas & Parry

(57) ABSTRACT

An automatic tuning circuit for matching an antenna to a radio receiver. The automatic tuning circuit includes a tunable non-Foster circuit for coupling the receiver and the antenna; and sensing and feedback circuits for sensing the combined capacitance of the tunable non-Foster circuit and the antenna and for tuning the tunable non-Foster circuit to automatically minimize the combined capacitance of the tunable non-Foster circuit and the antenna.

45 Claims, 4 Drawing Sheets

(56) References Cited

U.S. PATENT DOCUMENTS

| | | | |
|---|---|---|---|
| 6,518,930 | B2 | 2/2003 | Itoh |
| 6,525,695 | B2 | 2/2003 | McKinzie |
| 6,538,621 | B1 | 3/2003 | Sievenpiper et al. |
| 6,768,472 | B2 | 7/2004 | Alexopoulos et al. |
| 6,917,343 | B2 | 7/2005 | Sanchez |
| 6,952,565 | B1 | 10/2005 | Takeda |
| 7,042,419 | B2 | 5/2006 | Werner |
| 7,245,269 | B2 | 7/2007 | Sievenpiper |
| 7,586,384 | B2 | 9/2009 | Ranta |
| 7,619,568 | B2 | 11/2009 | Gillette |
| 7,847,633 | B2 | 12/2010 | Kinget |
| 7,852,174 | B2 | 12/2010 | Cathelin |
| 7,880,568 | B2 | 2/2011 | Amin et al. |
| 7,941,022 | B1 | 5/2011 | Schaffner |
| 8,111,111 | B2 | 2/2012 | Van Bezooijen |
| 8,263,939 | B2 | 9/2012 | Delaney |
| 8,358,989 | B2 | 1/2013 | Kakuya |
| 8,374,561 | B1 | 2/2013 | Yung |
| 8,436,785 | B1 | 5/2013 | Lai |
| 8,451,189 | B1 | 5/2013 | Fluhler |
| 8,639,203 | B2 | 1/2014 | Robert et al. |
| 8,957,831 | B1 | 2/2015 | Gregoire |
| 8,959,831 | B2 | 2/2015 | Smith |
| 9,093,753 | B2 | 7/2015 | Jung |
| 2002/0041205 | A1 | 4/2002 | Oppelt |
| 2002/0167457 | A1 | 11/2002 | McKinzie |
| 2003/0112186 | A1 | 6/2003 | Sanchez |
| 2004/0056814 | A1 | 3/2004 | Park |
| 2004/0227668 | A1 | 11/2004 | Sievenpiper |
| 2004/0263420 | A1 | 12/2004 | Werner |
| 2005/0184922 | A1 | 8/2005 | Ida |
| 2007/0182639 | A1 | 8/2007 | Sievenpiper et al. |
| 2008/0088390 | A1 | 4/2008 | Cathelin |
| 2008/0094300 | A1 | 4/2008 | Lee |
| 2008/0164955 | A1 | 7/2008 | Pfeiffer |
| 2008/0242237 | A1 | 10/2008 | Rofougaran |
| 2008/0284674 | A1 | 11/2008 | Herz et al. |
| 2009/0025973 | A1 | 1/2009 | Kazantsev |
| 2010/0039111 | A1 | 2/2010 | Luekeke |
| 2010/0039343 | A1 | 2/2010 | Uno |
| 2010/0149430 | A1 | 6/2010 | Fulga |
| 2010/0225395 | A1 | 9/2010 | Patterson |
| 2010/0231470 | A1 | 9/2010 | Lee |
| 2010/0238085 | A1 | 9/2010 | Fuh |
| 2011/0018649 | A1* | 1/2011 | David et al. .................. 331/158 |
| 2012/0256709 | A1 | 10/2012 | Hitko |
| 2012/0256811 | A1 | 10/2012 | Colburn |
| 2013/0009720 | A1 | 1/2013 | White |
| 2013/0200947 | A1 | 8/2013 | Alexopoulos |

FOREIGN PATENT DOCUMENTS

| | | |
|---|---|---|
| EP | 0295704 A2 | 12/1988 |
| EP | 2 290 745 A1 | 3/2011 |
| GB | 2288502 A | 10/1995 |
| JP | 2008 278159 A | 11/2008 |
| TW | 200845482 | 11/2008 |
| WO | 2006054246 A1 | 5/2006 |
| WO | 2009/090244 A1 | 7/2009 |

OTHER PUBLICATIONS

U.S. Appl. No. 13/177,479, filed Jul. 6, 2011, White, et al.
Bezooijen, et al., "Rf-MEMS based adaptive antenna matching module", IEEE Radio Frequency Integrated Circuits Symposium, p. 573-576, 2007.
Staple, et al. "The End of Spectrum Scarcity", IEEE Spectrum, p. 1-5, Mar. 2004.
From U.S. Appl. No. 13/177,479 (now published as US 2013-0009720 A1), Office Action mailed on Jun. 4, 2014.
IPRP for related PCT/US2012/045632 mailed on Jul. 10, 2013.
ISR for related PCT/US2012/032648 mailed on Dec. 14, 2012.
IPRP and ISR for related PCT/US2012/32638 mailed on Jun. 27, 2013 and Oct. 29, 2012.
From U.S. Appl. No. 12/768,563 (now U.S. Pat. No. 8,374,561), Application and Office Actions including but not limited to the Office Actions dated Jun. 13, 2012; Oct. 9, 2012; and Oct. 23, 2012.
From U.S. Appl. No. 13/177,479, Application and Office Actions.
From U.S. Appl. No. 13/441,659, Application and Office Actions.
From U.S. Appl. No. 13/441,730, Application and Office Actions.
PCT International Preliminary Report on Patentability (Chapter I) dated Oct. 8, 2013 for PCT Application No. PCT/US2012/032648 with PCT Written Opinion mailed on Dec. 14, 2012.
PCT Search Report and Written Opinion from PCT/US2012/045632 dated Jan. 10, 2013.
PCT Written Opinion from PCT/US2012/032638 mailed on Oct. 29, 2012.
Brennan, et al., "The CMOS negative impedance converter", IEEE Journal of Solid-State Circuits, 32(5), Oct. 1988.
Colburn, et al.,"Adaptive Artificial Impedance Surface Conformal Antennas", Proc. IEEE Antennas and Propagation Society Int. Symp., 2009, pp. 1-4.
Fong, et al.,"Scalar and tensor holographic artificial impedance surface", Trans. Antennas and Propag., vol. 58, pp. 3212-3221, Oct. 2010.
Gregoire, et al., "Non-foster metamaterial", Antenna Applications Symposium 2011, Sep. 2011.
Kern, D.H. Werner and M. J. Wilhelm, "Active negative impedance loaded EBG structures for the realization of ultra-wideband artificial magnetic conductor", Proc. IEEE Antennas and Propagation Society Int. Symp., 2003, pp. 427-430.
Linvill,"Transistor negative-impedance converters", Proceedings of the IRE, vol. 41, pp. 725-729, Jun. 1953.
Mechkov,"A heuristic approach to teaching negative resistance phenomenon" Third International Conference—Computer Science '06, Istanbul, Turkey, Oct. 12-15, 2006 (6 pgs).
S.E. Sussman and R.M. Rudish,"Non-Foster Impedance matching for transmit applications" IEEE Xplore, EDO Corporation and Dept. of Electrical and Computer Engineering. pp. 53-56, Mar. 6-8, 2006.
S.E. Sussman-Fort and R. M. Ruddish "Non-foster impedance matching of electrically-small antennas", IEEE Trans. Antennas and Propagation 57(8). Aug. 2009, pp. 2230-2241.
S.E. Sussman-Fort and R.M. Rudish. EDO Corporation,"Increasing efficiency or bandwidth of electrically small transmit antennas by impedance matching with non-foster circuits", Progress in Electromagnetics Research Symposium 2006, Cambridge, USA, Mar. 26-29.
S.E. Sussman-Fort, "Matching network design using non-foster impedances," International Journal of RF and Microwave Computer-Aided Engineering, 16(2), pp. 135-142, Feb. 2006.
S.E. Sussman-Fort, Ph.D, Slideshow for"Matching network design using non-foster impedance," EDO Corporation (printed from the Internet on Jun. 30, 2011), (43 pages).
S.E. Sussman-Fort,"Gyrator-based biquad filters and negative impedance converters for microwaves," International Journal of RF and Microwave computer-aided engineering. 8(2):86-101, 1998.
Song and Rojas,"Non-foster impedance matching of electrically small antennas," Proc. IEEE Ant. Prop. Int. Symp., Jul. 2010.
White,et al., "A Variable negative-inductance integrated circuit at UHF frequencies", IEEE MWCL, 22(1), Jan. 2012.
From U.S. Appl. No. 13/441,659, Office Action mailed on Feb. 24, 2014.
ISR and WO for corresponding PCT/US2012/045632 mailed on Jan. 10, 2013.
Sussman-Fort, S.E., et al., "Non-Foster Impedance Matching of Electrically-Small Antennas", Aug. 2009, IEEE Transactions, vol. 58, Issue 8. pp. 2230-2241.
White Paper by the Virginia Tech Antenna Group of Wireless @ Virginia Tech"Non-foster reactance matching for antennas" pp. 1-5 http://wireless.vt.edu/research/Antennas_Propagation/Whitepapers/Whitepaper-Non-Foster_Reactance_Matching_for_Antennas.pdf in related U.S. Appl. No. 12/768,563.
From U.S. Appl. No. 13/441,659 (now published as US 2012-0256811), Office Action mailed on Jul. 1, 2014.
From U.S. Appl. No. 13/441,730 (now published as US 2012-0256709), Office Action mailed on Jul. 28, 2014.

(56) References Cited

OTHER PUBLICATIONS

EPO Supplementary European Search Report with European Search Opinion dated Jul. 29, 2014 from European Patent Application No. 12767559.3.
Hrabar S., et al., "Towards active dispersion less ENZ metamaterial for cloaking applications", Metamaterials, Elsevier BV, NL, vol. 4, No. 2-3, Aug. 1, 2010, pp. 89-97.
Gregoire, Daniel J., et al., "Wideband Artificial Magnetic Conductors Loaded With Non-Foster Negative Inductors", IEEE Antennas and Wireless Propagation Letters, IEEE, Piscataway, NJ, US, vol. 10, Dec. 26, 2011, pp. 1586-1589.
Kern D. J., et al., "Design of Reconfigurable Electromagnetic Bandgap Surfaces as Artificial Magnetic Conducting Ground Planes and Absorbers", Antennas and Propagation Society International Symposium 2006, IEEE Albuquerque, NM, USA Jul. 9-14, 2006, Piscataway, NJ, USA, IEEE, Piscataway, NJ, USA, Jul. 9, 2006, pp. 197-200.
EPO Supplementary European Search Report with European Search Opinion dated Oct. 8, 2014 from European Patent Application No. 12768357.1.
Chen, Ying et al., "Wideband Varactorless LC VCO Using a Tunable Negative-Inductance Cell", IEEE Transactions on Circuits and Systems, I: Regular Papers, IEEE, US, vol. 57, No. 10, Oct. 1, 2010, pp. 2609-2617 and II. A Principle of Tunable NI Cell, p. 2609.
Ramirez-Angulo, J. et al.: "Simple technique using local CMFB to enhance slew rate and bandwidth of one-stage CMOS op-amps", Electronics Letters, IEE Stevenage, GB, vol. 38, No. 23, Nov. 7, 2002, pp. 1409-1411.
From U.S. Appl. No. 13/441,659 (now published as US 2012-0256811), Notice of Allowance mailed on Oct. 30, 2014.
From U.S. Appl. No. 13/441,730 (now published as US 2012-0256709), Notice of Allowance mailed on Nov. 10, 2014.
From U.S. Appl. No. 13/177,479 (now published as US 2013-0009720 A1), Office Action mailed on Dec. 2, 2014.
Office Action dated Oct. 27, 2014 from Chinese Patent Application No. 2012800334482 with English translation.
Office Action dated Dec. 2, 2014 from Chinese Patent Application No. 201280021746.X with English summary.
Adonin, A. et al. "Monolith Optoelectronic Integrated Circuit With Built-In Photo-voltaic Supply for Control and Monitoring," 1998 IEEE International conference on electronics, circuits and systems, vol. 2, pp. 529-531.
Costa, F., et al., "On the bandwidth of high-impedance frequency selective surfaces," IEEE AWPL, vol. 8, pp. 1341-1344, 2009.
Foster, R. M., "A reactance theorem", Bell Systems Technical Journal, vol. 3, pp. 259-267, 1924.
Gower, John, Optical Communications Systems, 2nd edition, Prentice Hall, 1993, pp. 40-46 (8 pages).
Gregoire, D. J.,"A coaxial TEM cell for direct measurement of UHF artificial magnetic conductors", IEEE Antenna and Propagation Magazine, vol. 54, 251-290, Apr. 2012.

Luukkonen, O. et al, "Simple and accurate analytical model of planar grids and high-impedance surfaces," IEEE Trans. Antennas Propagation, vol. 56, 1624-1632, Jun. 2008.
Sievenpiper, et al., "High-impedance electromagnetic surfaces with a forbidden frequency band," IEEE Trans. Microwave Theory Tech., vol. 47, No. 11, pp. 2059-2074, Nov. 1999.
Stearns, S., "Non-Foster circuits and stability theory," Proc. IEEE Ant. Prop. Int. Symp., 2011, pp. 1942-1945.
White, C. R. et al., "A variable negative-inductance integrated circuit at UHF frequencies," Microwave and Wireless Components Letters, IEEE, vol. 22, No. 1, 35-37, Jan. 2012.
White, C. R., "A shallow varactor-tuned cavity-backed-slot antenna with a 1.9:1 tuning range," IEEE Trans. Antennas Propagation, 58(3), 633-639, Mar. 2010.
U.S. Appl. No. 13/910,039, filed Jun. 4, 2013, Gregoire.
U.S. Appl. No. 14/188,225, filed Feb. 24, 2014, Gregoire.
U.S. Appl. No. 14/188,264, filed Feb. 24, 2014, White.
U.S. Appl. No. 14/335,737, filed Jul. 18, 2014, White.
U.S. Appl. No. 14/628,076, filed Feb. 20, 2015, White.
From U.S. Appl. No. 14/188,225, filed Feb. 24, 2014, Application, unpublished.
From U.S. Appl. No. 14/188,264, filed Feb. 24, 2014, Application, unpublished.
From U.S. Appl. No. 14/335,737, filed Jul. 18, 2014; non publication requested, Application, unpublished.
Office Action dated Jun. 8, 2015 from Chinese Patent Application No. 201280033448.2 with machine English translation.
Pozar, David M., *Microwave Engineering,* Second Edition, John Wiley & Sons, Inc., 1998, pp. 89-90 and 629-631 with table of contents (16 pages).
Sandel, B., Radio Frequency Amplifiers, A.S.T.C., Chapter 23, pp. 912-946, 1960.
Office Action dated Jul. 22, 2015 from Chinese Patent Application No. 201280021746.X with brief English summary.
From U.S. Appl. No. 14/628,076, filed Feb. 20, 2015, Application, unpublished.
EPO Extended Search Report with Search Opinion dated Mar. 19, 2015 corresponding European Patent Application No. 12806913.5.
Mirzaei, H, et al.: "A wideband metamaterial-inspired compact antenna using embedded non-Foster matching," Antennas and Propagation (APSURSI), 2011 IEEE International Symposium on, IEEE, Jul. 3, 2011, pp. 1950-1953.
U.S. Appl. No. 14/856,541, filed Sep. 16, 2015, Gregoire.
From U.S. Appl. No. 14/856,541, filed Sep. 16, 2015; non publication request filed, Application and Office Actions, unpublished.
From U.S. Appl. No. 13/910,039 (non publication requested), Office Action mailed on Nov. 25, 2015, unpublished.
Office Action from Chinese Patent Application No. 201280021449.5 dated Sep. 29, 2015 with brief English summary.
Office Action from Chinese Patent Application No. 201280033448.2 dated Nov. 17, 2015 with brief English summary.
From U.S. Appl. No. 14/188,225 (now published as US 2015-0244080 A1), Office Action dated Nov. 3, 2015.

* cited by examiner

WIDE BANDWIDTH AUTOMATIC TUNING CIRCUIT

CROSS REFERENCE TO RELATED APPLICATIONS

This application is a continuation in part of U.S. patent application Ser. No. 13/177,479 filed on Jul. 6, 2011 and entitled "Wide Bandwidth Automatic Tuning Circuit", the disclosure of which is hereby incorporated herein by reference.

This application is also related to and claims the benefit of U.S. Provisional Patent Application Ser. No. 61/505,037 filed on Jul. 6, 2011 and entitled "Differential negative impedance converters and inverters with tunable conversion ratios", the disclosure of which is hereby incorporated herein by reference.

TECHNICAL FIELD

This invention relates to a wide bandwidth automatic tuning circuit. Automatic tuning circuits are used to connect a transmitter and/or a receiver to an antenna with a better impedance match than if the transmitter and/or the receiver were directly connected to the antenna.

BACKGROUND

The useable radio spectrum is limited and traditionally the available spectrum has been licensed to particular users or groups of users by governmental agencies, such as the Federal Communications Commission in the United States. This licensing paradigm may be on the cusp of change. In the article "The End of Spectrum Scarcity" published by IEEE Spectrum, the authors note that while some available spectrum is congested, much of it is underutilized. They predict a future where spectrum is cooperatively shared and where smart antennas will adaptively lock onto a directional signal and when used in a transmission mode, operate directionally as opposed to omnidirectionally.

In terms of sharing spectrum, one way of doing so is by the use of spread spectrum technologies. Ultra-wideband (UWB) technology uses ultra wide bandwidths (for example, in excess of 500 MHz) to transmit information which in theory at least should not interfere with existing narrow band licensees (whose narrow band transmissions have bandwidths in the 0.5 to 15 KHz range).

Another spectrum sharing technique which is currently under discussion is cognitive radio which envisions using underutilized portions of the radio spectrum on an as needed basis. Cognitive radio can adapt to using different parts or portions of the radio spectrum when those parts or portions are not being actively used by another user.

Both UWB and cognitive radio have a need for widebanded communication equipment, with bandwidths significantly wider than found in most conventional radio equipment today. It is believed that future radio equipment will operate over much wider bandwidths than typical radio equipment does today.

It is well known that the performance of electrically-small antennas (ESAs) is limited when using traditional (i.e. passive) matching networks. Specifically, ESAs have high quality factor, leading to a tradeoff between bandwidth and efficiency. The most common definition of a ESA is an antenna whose maximum dimension (of an active element) is no more than $\lambda/2\pi$ of a wavelength of the frequencies at which the antenna is expected to operate. So, for a dipole with a length of $\lambda/2\pi$, a loop with a diameter of $\lambda/2\pi$, or a patch with a diagonal dimension of $\lambda/2\pi$ would be considered electrically small.

ESAs are very popular. They allow the antennas to be small. But due to their smallness, they can be very narrow banded.

The conventional way of dealing with an antenna which is used with a receiver and/or a transmitter with operates over a frequency band, and particularly where the antenna is mis-sized (electrically small) compared the frequency to be utilized, is to use an antenna matching network. Antenna matching networks operate ideally only at some particular frequency and therefore if the transmitter or receiver changes frequency, the mating network should normally be retuned to try to obtain an ideal match between the transmitter or receiver.

A passive adaptive antenna match is taught by U.S. Pat. No. 4,234,960. The antenna in U.S. Pat. No. 4,234,960 is resonated by a passive tuning circuit that is adjusted using a motor. A phase detector senses the presence of reactance and drives the motor until the reactance has been eliminated. This has two disadvantages: 1) the bandwidth is narrow due to the use of a passive tuning circuit, which necessitates the use of coarse (frequency sensing) and fine adjust, and 2) the motor driven tuning is slower than electronic tuning.

A "RF-MEMS based adaptive antenna matching module" taught by A. V. Bezooijen, et al., 2007 IEEE RFIC Symposium, resonates the antenna with a MEMS switched capacitor array. A phase detector senses the phase of the input impedance and steps the capacitance of the matching circuit either up or down by 1 increment depending on the sign of the phase. Disadvantages: 1) a positive capacitance does not resonate a monopole-type ESA 2) passive matching circuit results in narrow-band solution for ESA; and 3) digital tuning gives limited number of states.

Non-Foster matching networks overcome the limitations of passive circuits by using active circuits to synthesize negative capacitors and negative inductors in the antenna matching networks. When placed correctly, these circuits can directly subtract the from the antenna's reactance. For example, a 6" monopole antenna has a reactance that may be approximated by a 3 pF capacitor at frequencies well below resonance. When combined with a −3.1 pF non-Foster capacitor, the net reactance is given by a 93 pF capacitor (using Eqn. (3) below), which is a 30 times improvement since the reactance is reduced by 30 times.

There are two related problems with this approach that need to be addressed before non-Foster matching is robust enough to be deployed in products: stability and accuracy. Negative capacitance is achieved using feedback circuits whose stability depends on both the internal circuit parameters and the load impedance; instability leads to either oscillation (i.e. emission of a periodic waveform from the circuit) or latchup. Unfortunately, the optimal impedance match typically occurs near the point where the stability margin goes to zero. Since non-Foster matching involves the subtraction of large reactances, high accuracy (tolerance~1/Q) is needed to ensure both stability and optimal antenna efficiency. Consider the example just given, where the 6" monopole antenna, which has a reactance that may be approximated by a 3 pF capacitor at frequencies well below resonance, is combined with a −3.1 pF non-Foster capacitor. The match is theoretically better with a −3.05 pF non-Foster capacitor, but if the net capacitance goes negative (see Eqn. (3)), then the match is unstable. There will probably always be manufacturing tolerances in making both antennas and circuits or devices, but as accuracy improves, the better the match network can be designed using a non-Foster negative impedance capacitor whose absolute value is even closer to the capacitance of the antenna. But accuracy and stability are related since the accuracy (or lack thereof) by which components can be manufactured will impact the likelihood of an unstable situation arising by reason of the combined antenna impedance and match network impedance being negative.

Component and manufacturing tolerances, as well as temperature and environmental loading effects, suggest that even a 10% error may be challenging to achieve using prior art non-Foster circuits.

Having a robust non-Foster automatic tuning circuit for coupling a transmitter and/or a receiver to an antenna, especially a ESA, would be useful for use in automobiles since it would allow the antenna design to be further reduced in size which is turn can lead to more aesthetic automobile designs and in vehicles generally (including automobiles, trucks, trains, planes, ship and boats) where a smaller antenna is likely to reduce drag and thereby increase efficiency. There are many more applications for this technology, such as the cognitive and UWB radios mentioned above.

BRIEF DESCRIPTION OF THE INVENTION

In one aspect the present invention provides an automatic tuning circuit for matching an antenna to a radio receiver, the automatic tuning circuit comprising: a tunable non-Foster circuit for coupling the receiver and the antenna; and sensing and feedback circuits for sensing the combined reactance of the tunable non-Foster circuit and the antenna and for tuning the tunable non-Foster circuit to automatically minimize the combined reactance of the tunable non-Foster circuit and the antenna. The receiver may be a transceiver.

In another aspect the present invention provides a tuning circuit for matching an antenna to a variable frequency oscillator, the automatic tuning circuit comprising: a tunable non-Foster circuit for coupling the variable frequency oscillator and the antenna; and sensing and feedback circuits for sensing the combined reactance of the tunable non-Foster circuit and the antenna and for tuning the tunable non-Foster circuit to minimize the combined reactance of the tunable non-Foster circuit and the antenna.

A method of matching an antenna to a radio receiver, the method comprising: coupling a tunable non-Foster circuit between the receiver and the antenna, the receiver and the antenna having a combined reactance; sensing the combined reactance of the tunable non-Foster circuit and the antenna in a sensing circuit; and tuning the tunable non-Foster circuit to minimize the combined reactance of the tunable non-Foster circuit and the antenna as sensed by the sensing circuit. The receiver may be a transceiver.

DETAILED DESCRIPTION

This invention provides an automatically-tuning non-Foster matching circuit, which automatically drives the input reactance ($X_{in}$) to zero at one frequency where $X_{in}$ is the imaginary part of the input impedance ($Z_{in}$), so $Z_{in}=R_{in}+jX_{in}$. It is well known that the performance of electrically-small antennas (ESAs) is limited when using traditional (i.e. passive) matching networks due to their high antenna Q. Non-Foster Circuits (NFCs) can reduce the antenna reactance by orders of magnitude by synthesizing negative capacitance or negative inductance, which are then placed in series (for example, when using negative capacitance to match monopole or dipole antennas) or parallel (for example, when using negative inductance to match slot or loop antennas) such that they cancel the antenna reactance over a broad bandwidth. A high degree of accuracy is desired to effectively cancel large antenna reactances. In addition, NFCs are conditionally stable, and typically have a very small stability margin at the point where they best cancel the antenna reactance. Therefore it is important to design and control the NFC circuit very accurately in order to optimize performance while keeping the circuit stable.

Considering a series R-L-C circuit, the input impedance is given by Eqn (1) below:

$$Z_{in}=R+sL+1/sC. \qquad \text{Eqn. (1)}$$

where R is the resistance, L is the inductance, C is the capacitance, $s=j\omega$, $\omega$ is the radian frequency, and $j=\text{sqrt}(-1)$. When terminated by a receiver impedance $R_0$, a loop is created with impedance $Z_{loop}=Z_{in}+R_0=R'+sL+1/sC$. It has been shown in the literature that the system is unstable if $Z_{loop}$ has zeros in the Right Half Plane (RHP); $Z_{loop}$ has zeros given by Eqn. (2) below:

$$S_z = 0.5\left(-\frac{R'}{L} \pm \sqrt{\left(\frac{R'}{L}\right)^2 - \frac{4}{LC}}\right). \qquad \text{Eqn. (2)}$$

It can be seen that when R' and L are >0, there is a RHP solution for $s_z$ if and only if C<0. Therefore, the net capacitance must be positive for stability. In addition, the circuit resonates when at the frequency given by $f_o=1/2\pi\sqrt{LC}$ when C is positive. With non-Foster matching, the negative capacitance produced by the NFC, $-C_{NF}$, is connected in series with the positive capacitance of the antenna, $C_a$, producing a net capacitance given by Eqn. (3) below:

$$C = \frac{-C_a C_{NF}}{C_a - C_{NF}}. \qquad \text{Eqn. (3)}$$

Therefore the circuit may be tuned to resonate at $f_o$ while remaining stable by starting with $-C_{NF}$ comfortably below $-C_a$ and tuning $-C_{NF}$ to approach $-C_a$. In theory, $-C_{NF}$ can equal $-C_a$ (so that perfect cancellation occurs), but if the combination of the two capacitances is a negative value, the condition is unstable. So in practice $-C_{NF}$ is preferably tuned to only to approach $-C_a$ with the difference being set by the gain of the feedback loop.

Figure 1:
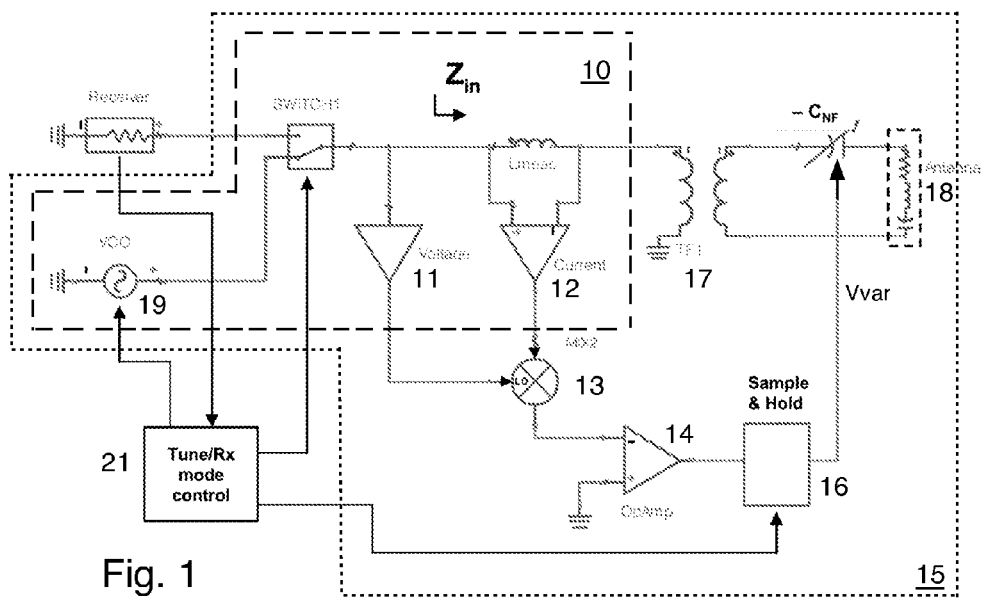
FIG. 1 is a schematic block diagram of an auto-tuning non-Foster matching circuit.

The circuit of FIG. 1 includes a tunable negative (i.e. non-Foster) capacitor $C_{NF}$, sensing circuitry 10 for sensing the reactance in real-time, and an associated feedback loop 15 that automatically drives the input reactance $X_{in}$ to zero. In this embodiment, the sensing circuitry is also considered part of the feedback loop. The antenna is assumed to be a monopole whose length is typically much less than a quarter wavelength to enable the antenna is fit inside an appliance with houses the associated receiver and transmitter (a transceiver), such as, for example, a cellphone (and particularly a transceiver which needs to operate over a range of different frequency bands such as a multi-band cellphone, for example). Any sort of antenna with a series-type first resonance may be used in lieu of a monopole, such as a dipole antenna, a patch antenna, a F antenna, etc. In addition, inductive antennas with parallel-type resonances (e.g. slot and loop antennas) may be used when the negative (i.e. non-Foster) capacitor $C_{NF}$ is replaced by a variable negative inductance. In this alternative embodiment, the negative inductance is placed in series with the antenna. This alternative embodiment is less desirable than the embodiment using the negative (i.e. non-Foster) capacitor $C_{NF}$.

This invention is primarily applicable to antennas with series type first resonances because the combined reactance of the antenna, the NFC, and $L_{meas}$ must have only one zero crossing as the reactance of the NFC is varied. This is not true for a parallel type resonance with a shunt tuning element because Lmeas is in series with the shunt elements. Therefore, the reactance has either zero or two zero crossings. Monopoles and dipoles are capacitive and have series type first resonance; slots and loops are inductive and have parallel type first resonance. This invention is also applicable to parallel resonant antennas with series negative inductors, as mentioned in the preceding paragraph.

The sensing circuit 10 includes a variable frequency oscillator 19 (which may be implemented by a voltage controlled oscillator or VCO) which injects a signal at the desired frequency of operation via a switch (SWITCH1); this signal may be either a transmit signal for transmitter or transceiver applications or a low output power oscillator that is switched onto the signal path (via SWITCH1) in order to measure the reactance at $Z_{in}$, for receive applications. If the circuit of FIG. 1 is to be used in a receiver application only, then the low output power oscillator 19 can preferably be designed to generate such low power that the receiver does not need to be licensed as a transmitter by governmental licensing authorities such as the FCC in the United States (a small amount of power is sent to the antenna). If the circuit of FIG. 1 is to be used in a transceiver application, then the transmitter portion of the transceiver can be conveniently used as the variable frequency oscillator 19.

The input voltage is directly sensed using a single-ended buffer 11 (which may be implemented as an Operational Amplifier (OpAmp)), and the input current is sensed by connecting a differential buffer 12 (which may be implemented as an OpAmp) across a small inductor, $L_{meas}$, that is inserted specifically for the reactance measurement. The small inductor may only impose one or two ohms of reactance and its value is a matter of design choice depending on the sensitivity desired. The voltage across $L_{meas}$ is proportional to the input current, but shifted by 90°. Therefore, multiplying the voltage and current signals using a double balanced mixer 13 (keeping only the DC output, using a low-pass filter if need be), directly results in a reactance measurement. The double balanced mixer is considered part of the feedback circuit in this detailed description, but it can also be considered part of the sensing circuit 10 as well.

A double balanced mixer 13 should be utilized in order to preserve the sign of the reactance. This voltage is then applied to an OpAmp 14, which produces the tuning voltage for the tunable negative capacitor such that the input reactance ($X_{in}$) is driven to zero.

This circuit may be used in two modes: continuous tuning and periodic tuning. Continuous tuning is useful for transmit antenna matching. In this mode, where the signal is constantly applied at a center frequency $f_0$, the feedback loop is always on and no sample and hold circuit 16 is needed and no mode control switch or circuit 21 is needed. The periodic mode is useful for receive antenna matching. In the periodic mode, the circuit is switched at SWITCH1 (in response to the state of mode control switch or circuit 21) between the receiver and the oscillator 19. The mode control switch or circuit 21 has two states: a tuning state and a receive state. When the mode control switch or circuit 21 is in its tuning state, the oscillator 19 applies a signal in the sensing circuit 10 and the feedback circuit 15 drives the reactance to zero while the sample and hold circuit 16 samples the tuning voltage. When the mode control switch or circuit 21 is in its receive state, the circuit is switched at SWITCH1 to the receiver but the just determined tuning voltage is held constant by the sample and hold circuit 16. In the preferred embodiment, the circuit starts up with $-C_{NF}$ comfortably below $-C_a$, and may be reset to that level at the beginning of each tuning state. The circuit may be switched into its tuning mode at an interval fast enough to adapt to environmental changes due to temperature or a dynamic environment and may be in the tuning (i.e. transmit) mode just long enough to tune the antenna so that interruptions to reception are minimized. In one example, the circuit may be switched into the tuning mode for 50 microseconds every 50 milliseconds.

The sample and hold circuit 16 maintains the tuning voltage on the NFC while the receiver is in its receive state. Reasons for doing this periodically are:

(1) The characteristics of the antenna will change. The classic example is a cell phone which will have a different impedance when it is in the user's hand than it will on the table, which could lead to oscillation. Temperature effects can additionally affect the characteristic of a cellphone. These changes are the prime motivation for this invention.

(2) It may be beneficial to tune to different frequencies for different operating modes (e.g. 1.8 GHz one moment, then FM or TV broadcast frequencies at another moment).

The transformer 17 preferably couples the sensing circuit to the antenna 18 and the NFC (implemented as the negative capacitor $-C_m$ in this embodiment). Depending on the configuration of the antenna match, the NFC could instead be implemented as a negative inductor. Many antenna match circuits are known in the art which utilize variable capacitors and/or inductors, and selecting one of the variable capacitors or inductors in such circuits to be implemented as a negative reactive element (i.e. negative capacitor or negative inductor) can have a profound impact on the bandwidth of the antenna match circuit.

The antenna 18 may be any sort of antenna, but if a ESA is utilized, then it is preferably either a dipole or a monopole antenna as those antenna types are frequently used ESAs.

Figure 2:
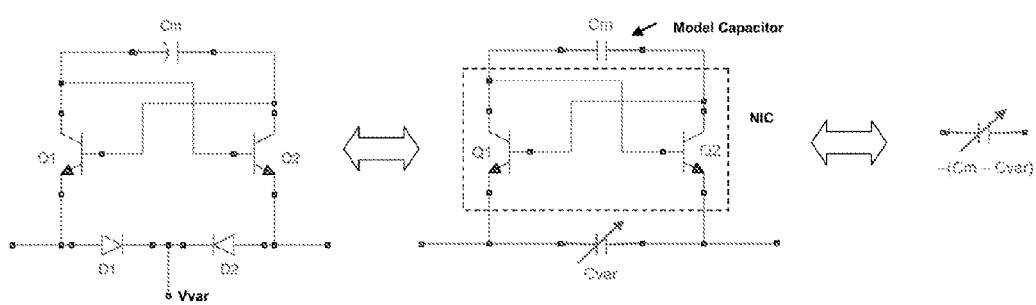
FIG. 2 is a schematic diagram of an exemplary tunable non-Foster negative capacitor. The negative impedance converter transforms the model capacitor, Cm, to a negative capacitance, −Cm. The variable capacitance, Cvar, provides tunability.

An exemplary tunable NFC is shown in FIG. 2 as three different representations of the same circuit. On the left hand side is a circuit with two varactor diodes which is electrically equivalent to the center presentation which shows a variable capacitor in place of the two varactor diodes. On the right hand side is the result (−(Cm−Cvar)). This circuit is based on Linvill's floating Negative Impedance Converter (NIC), but is an improvement there over and results in a tunable negative capacitance. A positive capacitance Cm is connected between the collectors of bipolar transistors Q1 and Q2. The input impedance looking into the emitters is given by −1/jωCm; therefore, the combination of Cm and the NIC is equivalent to a capacitor with value −Cm. A variable capacitor (in the center representation) with capacitance Cvar is connected between the emitters of Q1 and Q2; this combines with −Cm to give a tunable capacitance given by −(Cm−Cvar) between the two emitters. In embodiment on the left hand side, the variable capacitor is implemented by back-to-back reverse-biased varactor diodes D1 and D2, where the bias voltage from the sample and hold circuit 16 is applied to the Vvar node relative to the emitter voltage.

Figure 3:
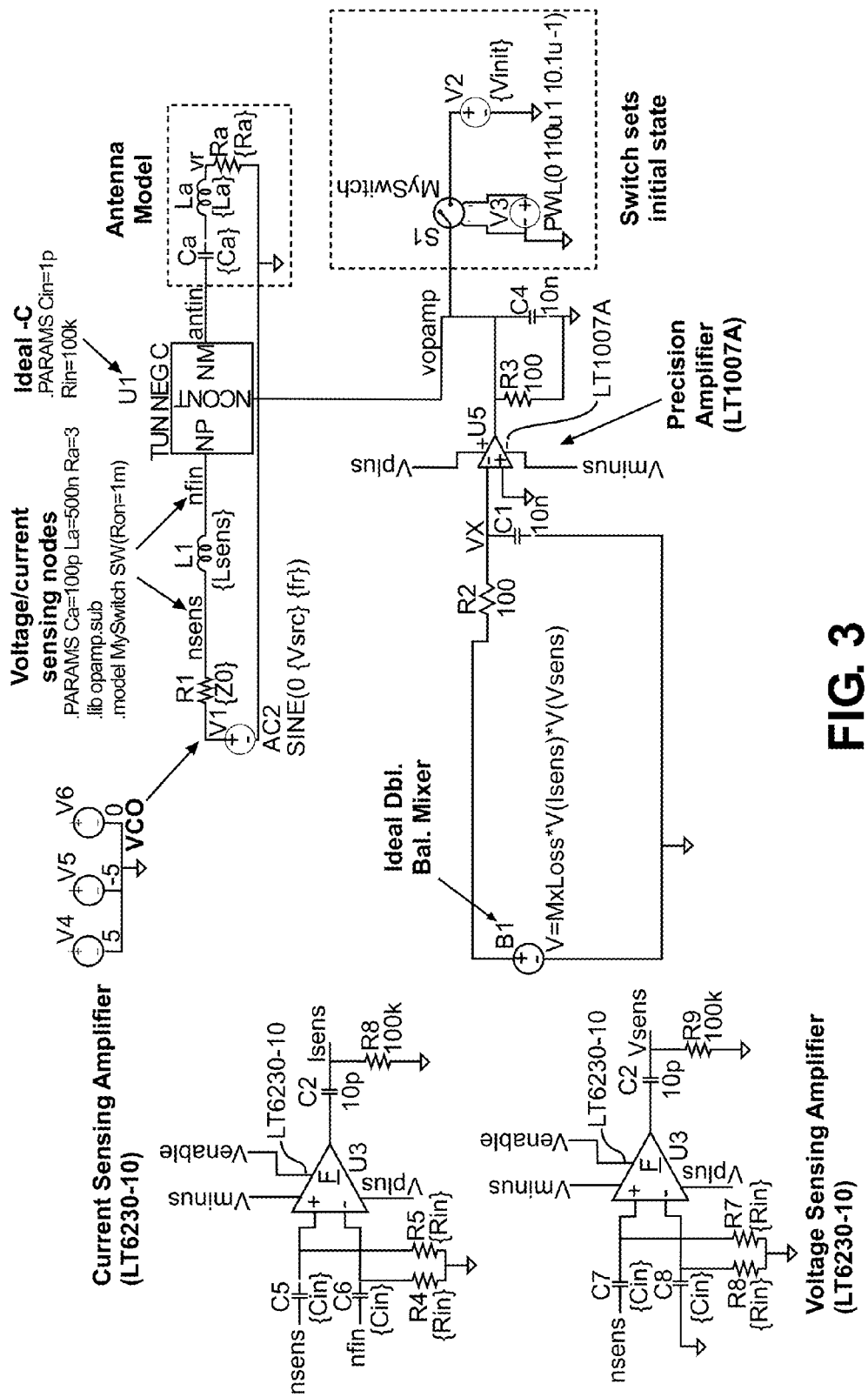
FIG. 3 depicts a simulation setup for a SPICE simulation. The circuits of FIGS. 1 and 2 have been simulated using an ideal non-Foster negative capacitor and an ideal double balanced mixer.
Figure 4:
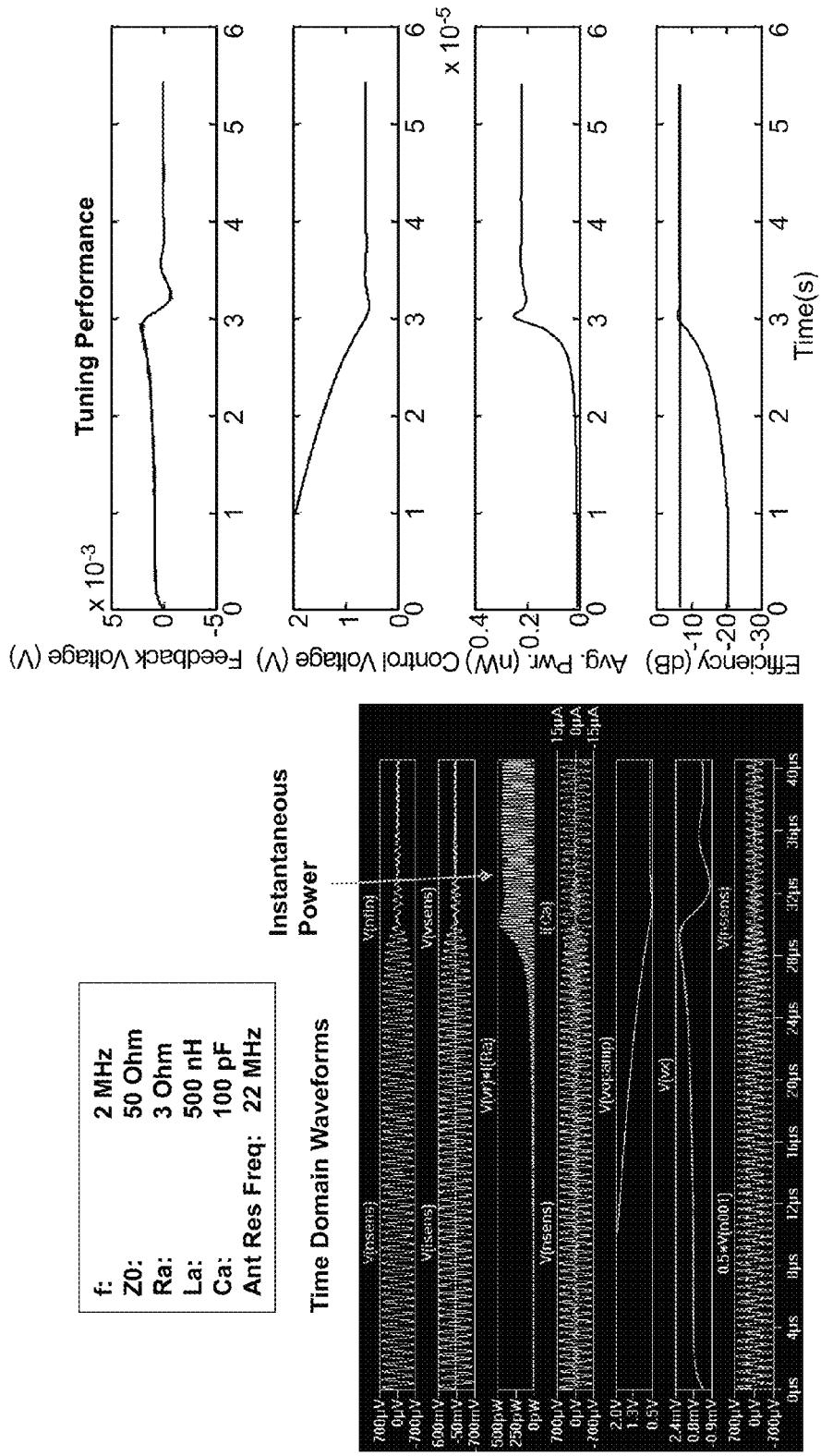
FIG. 4 depicts the time domain results of the SPICE simulation of FIG. 3. The circuit converges to optimal efficiency in 35 microseconds. The efficiency improvement is more than 10 dB.

A SPICE simulation has been performed of the circuits of FIGS. 1 and 2, and the setup therefor is shown in FIG. 3. The antenna 18 is modeled as a series R-L-C circuit with values, and is tuned with an ideal voltage-controlled negative capacitor 19 whose capacitance in pF is given by −C=−80−35*Vc, where Vc is the control voltage (equal to Vvar in FIG. 2). Voltage source V2 and switch S1 set the initial bias state (−C=−150 pF), and the feedback loop is closed at 10 microseconds. The voltage and current sensing buffers are implemented with high-speed operational amplifiers, and the double-balanced mixer is implemented with a behavioral model assuming ideal multiplication and 6 dB insertion loss. The final element of the feedback loop is a precision operational amplifier to drive the reactance to zero. The simulation demonstrates convergence to the optimum efficiency (−6.7 dB) in 25 microseconds. The final non-Foster capacitance value is −C=−101 pF, which increases the total capacitance from 100 pF to 8.9 nF and resonates the antenna at 2 MHz.

Figure 5:
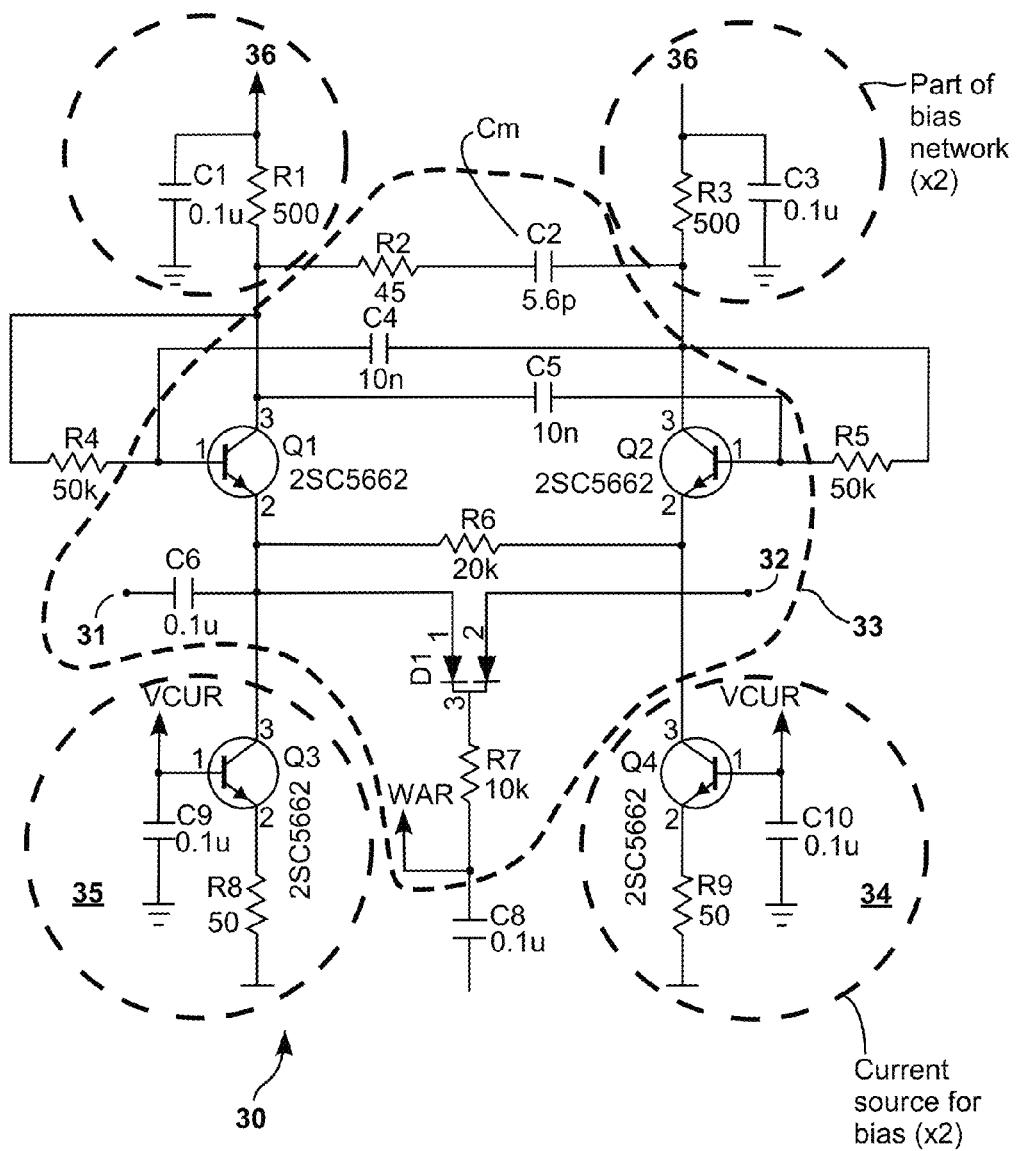
FIG. 5 depicts a schematic diagram of a prototype variable non-Foster circuit.

The circuits of FIGS. 2 and 5 have been built and tested. The test results are discussed in Appendix A to this application entitled "A Non-Foster-Enhanced Monopole Antenna". In that embodiment, after testing, Cm was selected to be a 5.6 pF capacitor while Cvar should preferably have a tuning range of about 4-10 pF in that embodiment, so the diodes D1 and D2, being in series, should then having a tuning range of about 2-5 pF in that embodiment.

The circuits of FIG. 2 show one possible embodiment of a NFC to implement the negative capacitor −Cm. Other NFC are depicted in the U.S. Provisional Patent Application identified above which is incorporated herein by reference. In particular, the tunable NFC shown in FIG. 1(c) thereof could be used in place of the circuits of FIG. 2. Since the tunable NFC shown in FIG. 1(c) thereof is tunable as described therein, the addition of capacitor Cvar is not required at the negative impedance output thereof, but nevertheless the capacitor Cvar (preferably implemented as diodes D1 and D2) may be added negative impedance output thereof similarly to the modification to Linvill's circuit proposed by FIG. 2 hereof.

As is also mentioned in Appendix A, adding some resistance in series with Cm results in negative resistance at the output of the NFC which in turn adds gain.

The circuits of FIG. 2 will produce a negative capacitance even if Cm is omitted due to the parasitic capacitance associated with transistors Q1 and Q2. We find it preferable to include a capacitor Cm since varactor diodes D1 and D2 contribute a positive capacitance which is somewhat smaller than the value of Cm, to obtain, as a result, a rather small negative capacitance which is exactly what is needed to provide a match with electrically small antennas. If Cm is omitted, the circuit theoretically works just fine, but there are practical problems in finding varactor diodes D1 and D2 which would contribute a positive capacitance which is somewhat smaller than the value contributed by the parasitic capacitance associated with transistors Q1 and Q2.

FIG. 5 depicts a schematic diagram of a preferred embodiment of a negative capacitance circuit 30, where variable negative capacitance appears between terminals 31 and 32. It should be readily apparent that the core 33 of the circuit 30 is nearly identical to the embodiment described with reference to FIG. 2 and includes transistors Q1 and Q2, capacitance Cm and a pair of reverse-biased varactor diodes which accept the tuning voltage Vvar. In addition, resistors R2 and R6 compensate for parasitic resistances of the circuit; resistor R7 presents a high impedance to the RF signal; DC blocking capacitors C4 and C5 allow a difference in potential between the collectors and bases of Q1 and Q2, and capacitor C6 AC couples the core of the circuit to pin 31. In a preferred embodiment, pin 32 may be connected to an antenna while pin 31 may be connected a transformer 17 or a reactance-sensing circuit 10. Current sources 34 and 35 accept control voltage Vcur and force a current to flow through transistors Q1 and Q2 (preferably 10 mA each) and resistors R1 and R2 are connected between the collectors of Q1 and Q2, respectively, and the supply voltage 36 (preferably 20V). Resistors R4 and R5 complete the bias network, creating a difference in potential between the collectors and bases of Q1 and Q2, respectively.

It will be apparent to a skilled practitioner that while NPN transistors are shown in FIG. 5, PNP transistors may be substituted by inverting the supply voltages. Furthermore, field-effect transistors (FETs) or other transistor-like devices may be used in place of bipolar transistors with minor modifications to the bias network.

Other NFC are depicted in the U.S. Provisional Patent Application identified above which is incorporated herein by reference. In particular, the tunable NFC shown in FIG. 1(c) thereof could be used in place of the circuits of FIG. 5. This NIC circuit converts a model positive capacitance to a negative capacitance whose value is scaled by the ratio of the resistance values of two resistors. Therefore, the NFC capacitance may be varied by varying the resistance of at least one resistor as described in the above identified application. Also depicted in the above identified U.S. Provisional Patent Application are circuits capable of generating negative inductance from either a positive inductor or a positive capacitor. Any of these circuits may be inserted as the tunable NFC in FIG. 1 of the present application by choosing a single resistor to be variable, thereby making a variable NFC with a single control voltage.

Having described the invention in connection with certain embodiments thereof, modification will now suggest itself to those skilled in the art. As such, the invention is not to be limited to the disclosed embodiments except as is specifically required by the appended claims.

What is claimed is:

1. An automatic tuning circuit for matching an antenna to a radio receiver, the automatic tuning circuit comprising:
 a tunable non-Foster circuit coupling the receiver and the antenna; and
 sensing and feedback circuits sensing the combined reactance of the tunable non-Foster circuit and the antenna and for tuning the tunable non-Foster circuit to automatically minimize the combined reactance of the tunable non-Foster circuit and the antenna without making the combined reactance of the tunable non-Foster circuit and the antenna equal to zero so that an absolute value of the reactance of the tunable non-Foster circuit is maintained at a slightly smaller value than an absolute value of the reactance of the antenna to maintain stability of the tunable non-Foster circuit.

2. The automatic tuning circuit of claim 1 wherein the tunable non-Foster circuit comprises an otherwise non-tunable non-Foster circuit with a variable capacitance added across a negative impedance output of the otherwise non-tunable non-Foster circuit to thereby render the otherwise non-tunable non-Foster circuit tunable.

3. The automatic tuning circuit of claim 2 wherein the variable capacitance is supplied by reverse biased varactor diodes coupled in parallel with the negative impedance output of the otherwise non-tunable non-Foster circuit, a junction point between the series coupled varactor diodes providing a control input to the tunable non-Foster circuit.

4. The automatic tuning circuit of claim 3 wherein the sensing and feedback circuits comprise:
   means for sensing an input impedance associated with the antenna and the tunable non-Foster circuit when a RF signal is applied to the antenna and the tunable non-Foster circuit via the means for sensing; and
   an operational amplifier whose output is coupled to the control input of the tunable non-Foster circuit.

5. The automatic tuning circuit of claim 4 wherein the sensing and feedback circuits further comprise a sample and hold circuit coupled between said operational amplifier and said control input of the tunable non-Foster circuit.

6. The automatic tuning circuit of claim 1 wherein the sensing and feedback circuits comprise:
   means for sensing an input impedance associated with the antenna and the tunable non-Foster circuit when a RF signal is applied to the antenna and the tunable non-Foster circuit via the means for sensing; and
   an operational amplifier whose output is coupled to a control input of the tunable non-Foster circuit.

7. The automatic tuning circuit of claim 6 wherein the sensing and feedback circuits further comprise a sample and hold circuit coupled between said operational amplifier and said control input of the tunable non-Foster circuit.

8. The automatic tuning circuit of claim 1 wherein the tunable non-Foster circuit emulates a variable negative capacitor and wherein the antenna is a dipole or a monopole.

9. A tuning circuit for matching an antenna to a variable frequency oscillator, the automatic tuning circuit comprising:
   a tunable non-Foster circuit coupling the variable frequency oscillator and the antenna; and
   sensing and feedback circuits for sensing the combined reactance of the tunable non-Foster circuit and the antenna and for tuning the tunable non-Foster circuit to minimize the combined reactance of the tunable non-Foster circuit and the antenna without making the combined reactance equal to zero and such that the combined reactance of the tunable non-Foster circuit is less than the reactance of the antenna and of the same sign.

10. The tuning circuit of claim 9 wherein the tunable non-Foster circuit comprises an otherwise non-tunable non-Foster circuit with a variable reactance added across a negative impedance output of the otherwise non-tunable non-Foster circuit to thereby render the otherwise non-tunable non-Foster circuit tunable.

11. The tuning circuit of claim 10 wherein the variable reactance is supplied by reverse biased varactor diodes coupled in parallel with the negative impedance output of the otherwise non-tunable non-Foster circuit, a junction point between the series coupled varactor diodes providing a control input to the tunable non-Foster circuit.

12. The tuning circuit of claim 11 wherein the sensing and feedback circuits comprise:
   means for sensing an input impedance associated with the antenna and the tunable non-Foster circuit when a RF signal is applied to the antenna and the tunable non-Foster circuit via the means for sensing; and
   an operational amplifier whose output is coupled to the control input of the tunable non-Foster circuit.

13. The tuning circuit of claim 12 wherein the sensing and feedback circuits further comprise a sample and hold circuit coupled between said operational amplifier and said control input of the tunable non-Foster circuit.

14. The tuning circuit of claim 9 wherein the sensing and feedback circuits comprise:
   means for sensing an input impedance associated with the antenna and the tunable non-Foster circuit when a RF signal is applied to the antenna and the tunable non-Foster circuit via the means for sensing; and
   an operational amplifier whose output is coupled to a control input of the tunable non-Foster circuit.

15. The tuning circuit of claim 14 wherein the sensing and feedback circuits further comprise a sample and hold circuit coupled between said operational amplifier and said control input of the tunable non-Foster circuit.

16. The tuning circuit of claim 9 wherein the tunable non-Foster circuit emulates a variable negative capacitor and wherein the antenna is a dipole or a monopole.

17. A tunable non-Foster circuit comprising:
   a conventional non-Foster circuit having an output where a negative capacitance is realized; and
   a variable capacitor coupled in parallel with the output of the conventional non-Foster circuit where the negative capacitance is realized, the variable capacitor having a capacitance less than the absolute value of the negative capacitance realized by the conventional non-Foster circuit, so that a variable negative capacitance is realized across the output of the conventional non-Foster circuit by varying the variable capacitor.

18. A method of matching an antenna to a radio receiver, the method comprising:
   coupling a tunable non-Foster circuit between the receiver and the antenna, the tunable non-Foster circuit and the antenna having a combined reactance;
   sensing the combined reactance of the tunable non-Foster circuit and the antenna in a sensing circuit; and
   tuning the tunable non-Foster circuit to minimize the combined reactance of the tunable non-Foster circuit and the antenna as sensed by the sensing circuit without making the combined reactance of the tunable non-Foster circuit and the antenna equal to zero so that an absolute value of the reactance of the tunable non-Foster circuit is maintained at a slightly smaller value than an absolute value of the reactance of the antenna to maintain stability of the tunable non-Foster circuit.

19. The method of matching the antenna to the radio receiver of claim 18 wherein the tunable non-Foster circuit comprises an otherwise non-tunable non-Foster circuit with a variable capacitance added across a negative capacitance output of the otherwise non-tunable non-Foster circuit to thereby render the otherwise non-tunable non-Foster circuit tunable.

20. The method of matching the antenna to the radio receiver of claim 19 wherein the variable capacitance is supplied by reverse biased varactor diodes coupled in series with the negative capacitance output of the otherwise non-tunable non-Foster circuit, a junction point between the series coupled varactor diodes providing a control input for the tunable non-Foster circuit.

21. The method of matching the antenna to the radio receiver of claim 20 wherein an input impedance is associated with the antenna, wherein the step of sensing the combined reactance of the tunable non-Foster circuit and the antenna includes applying a RF signal to the antenna and the tunable non-Foster circuit and wherein the step of tuning the tunable non-Foster circuit includes adjusting a negative capacitance of the tunable non-Foster circuit to minimize the the combined reactance of the tunable non-Foster circuit and the antenna while said RF signal is being applied to the antenna and the tunable non-Foster circuit.

22. The method of matching the antenna to the radio receiver of claim 18 wherein an input impedance is associated with the antenna, wherein the step of sensing the combined reactance of the tunable non-Foster circuit and the antenna includes applying a RF signal to the antenna and the tunable non-Foster circuit and wherein the step of tuning the tunable non-Foster circuit includes adjusting a negative capacitance of the tunable non-Foster circuit to minimize the the combined reactance of the tunable non-Foster circuit and the antenna while said RF signal is being applied to the antenna and the tunable non-Foster circuit.

23. The method of matching the antenna to the radio receiver of claim 18 wherein the tunable non-Foster circuit emulates a variable negative capacitor and wherein the antenna is a dipole or a monopole.

24. The method of matching the antenna to the radio receiver of claim 18 wherein the tuning the tunable non-Foster circuit to minimize the combined reactance of the tunable non-Foster circuit and the antenna as sensed by the sensing circuit occurs automatically.

25. A method of matching an antenna to a variable frequency oscillator, the method comprising:
coupling the variable frequency oscillator to the antenna via a tunable non-Foster circuit which emulates a variable negative capacitor; and
sensing the combined reactance of the tunable non-Foster circuit and the antenna; and
tuning the tunable non-Foster circuit to minimize the combined reactance of the tunable non-Foster circuit and the antenna without making the combined reactance of the tunable non-Foster circuit and the antenna equal to zero so that an absolute value of the reactance of the tunable non-Foster circuit is maintained at a slightly smaller value than an absolute value of the reactance of the antenna to improve stability of the tunable non-Foster circuit.

26. The method of matching the antenna to the variable frequency oscillator of claim 25 wherein the tunable non-Foster circuit comprises an otherwise non-tunable non-Foster circuit with a variable capacitor added across a negative capacitance output of the otherwise non-tunable non-Foster circuit to thereby render the otherwise non-tunable non-Foster circuit tunable.

27. The method of matching the antenna to the variable frequency oscillator of claim 26 wherein the variable capacitance is supplied by reverse biased varactor diodes coupled in series with the negative capacitance output of the otherwise non-tunable non-Foster circuit, a junction point between the series coupled varactor diodes providing a control input to the tunable non-Foster circuit.

28. The method of matching the antenna to the variable frequency oscillator of claim 27 wherein an input impedance is associated with the antenna, wherein the step of sensing the combined reactance of the tunable non-Foster circuit and the antenna includes applying a RF signal generated by said variable frequency oscillator to the antenna via the tunable non-Foster circuit and wherein the step of tuning the tunable non-Foster circuit includes adjusting a negative capacitance of the tunable non-Foster circuit to minimize the the combined reactance of the tunable non-Foster circuit and the antenna while said RF signal is being applied to the antenna via the tunable non-Foster circuit.

29. The method of matching the antenna to the variable frequency oscillator of claim 25 wherein an input impedance is associated with the antenna, wherein the step of sensing the combined reactance of the tunable non-Foster circuit and the antenna includes applying a RF signal generated by said variable frequency oscillator to the antenna via the tunable non-Foster circuit and wherein the step of tuning the tunable non-Foster circuit includes adjusting a negative capacitance of the tunable non-Foster circuit to minimize the the combined reactance of the tunable non-Foster circuit and the antenna while said RF signal is being applied to the antenna via the tunable non-Foster circuit.

30. The method of matching the antenna to the variable frequency oscillator of claim 24 wherein the tunable non-Foster circuit emulates a variable negative capacitor and wherein the antenna is a dipole or a monopole.

31. The method of matching the antenna to the variable frequency oscillator of claim 25 wherein the tuning the tunable non-Foster circuit to minimize the combined reactance of the tunable non-Foster circuit and the antenna as sensed by the sensing circuit occurs automatically.

32. A method of automatically matching an antenna to a radio receiver, the method comprising:
coupling a tunable non-Foster circuit between the receiver and the antenna;
sensing the combined reactance of the tunable non-Foster circuit and the antenna;
tuning the tunable non-Foster circuit to reduce the combined reactance of the tunable non-Foster circuit as sensed during said sensing step without attaining a zero value thereof;
repeating said sensing and tuning steps until said combined reactance of the tunable non-Foster circuit and the antenna attain a small, non-zero, value thereof.

33. The method of automatically matching the antenna to the radio receiver of claim 32 wherein the tunable non-Foster circuit comprises an otherwise non-tunable non-Foster circuit with a variable capacitor added across a negative capacitance output of the otherwise non-tunable non-Foster circuit to thereby render the otherwise non-tunable non-Foster circuit tunable.

34. The method of automatically matching the antenna to the radio receiver of claim 33 wherein the variable capacitor is supplied by reverse biased varactor diodes coupled in series with the negative capacitance output of the otherwise non-tunable non-Foster circuit, a junction point between the series coupled varactor diodes providing a control input to the tunable non-Foster circuit.

35. The method of automatically matching the antenna to the radio receiver of claim 34 wherein an input impedance is associated with the antenna, wherein the step of sensing the combined reactance of the tunable non-Foster circuit and the antenna includes applying a RF signal generated by a variable frequency oscillator to the antenna via the tunable non-Foster circuit and wherein the step of tuning the tunable non-Foster circuit includes adjusting a negative capacitance of the tunable non-Foster circuit to minimize the the combined reactance of the tunable non-Foster circuit and the antenna while said RF signal is being applied to the antenna via the tunable non-Foster circuit.

36. The method of automatically matching the antenna to the radio receiver of claim 32 wherein an input impedance is associated with the antenna, wherein the step of sensing the combined reactance of the tunable non-Foster circuit and the antenna includes applying a RF signal generated by a variable frequency oscillator to the antenna via the tunable non-Foster circuit and wherein the step of tuning the tunable non-Foster circuit includes adjusting a negative capacitance of the tunable non-Foster circuit to minimize the the combined reactance of the tunable non-Foster circuit and the antenna while said RF signal is being applied to the antenna via the tunable non-Foster circuit.

37. The method of automatically matching the antenna to the radio receiver of claim 32 wherein the tunable non-Foster circuit emulates a variable negative capacitor and wherein the antenna is a dipole or a monopole.

38. An automatic tuning circuit for matching an electrically small antenna having a capacitive reactance to a radio receiver, the automatic tuning circuit comprising:
    a tunable non-Foster circuit coupling the receiver and the antenna, the tunable non-Foster circuit generating a negative capacitance; and
    sensing and feedback circuits sensing the combined capacitance of the tunable non-Foster circuit and the antenna and for tuning the tunable non-Foster circuit to automatically reduce the combined capacitance of the tunable non-Foster circuit and the antenna to a near zero value without making the combined capacitance equal to zero so that an absolute value of the capacitance of the antenna is slightly larger than an absolute value of the negative capacitance of the tunable non-Foster circuit.

39. The automatic tuning circuit of claim 38 wherein the tunable non-Foster circuit comprises an otherwise non-tunable non-Foster circuit with a variable capacitance added across a negative impedance output of the otherwise non-tunable non-Foster circuit to thereby render the otherwise non-tunable non-Foster circuit tunable.

40. The automatic tuning circuit of claim 39 wherein the variable capacitance is supplied by reverse biased varactor diodes coupled in parallel with the negative impedance output of the otherwise non-tunable non-Foster circuit, a junction point between the series coupled varactor diodes providing a control input to the tunable non-Foster circuit.

41. The automatic tuning circuit of claim 40 wherein the sensing and feedback circuits comprise:
    means for sensing an input capacitance associated with the antenna and the tunable non-Foster circuit when a RF signal is applied to the antenna and the tunable non-Foster circuit via the means for sensing; and
    an operational amplifier whose output is coupled to the control input of the tunable non-Foster circuit.

42. The automatic tuning circuit of claim 41 wherein the sensing and feedback circuits further comprise a sample and hold circuit coupled between said operational amplifier and said control input of the tunable non-Foster circuit.

43. The automatic tuning circuit of claim 38 wherein the sensing and feedback circuits comprise:
    means for sensing the capacitance of the antenna and the tunable non-Foster circuit when a RF signal is applied to the antenna and the tunable non-Foster circuit via the means for sensing; and
    an operational amplifier whose output is coupled to a control input of the tunable non-Foster circuit.

44. The automatic tuning circuit of claim 43 wherein the sensing and feedback circuits further comprise a sample and hold circuit coupled between said operational amplifier and said control input of the tunable non-Foster circuit.

45. The automatic tuning circuit of claim 38 wherein the antenna is a dipole or a monopole.

* * * * *